(12) United States Patent
Maszara

(10) Patent No.: US 8,084,330 B2
(45) Date of Patent: Dec. 27, 2011

(54) THIN BODY SEMICONDUCTOR DEVICES HAVING IMPROVED CONTACT RESISTANCE AND METHODS FOR THE FABRICATION THEREOF

(75) Inventor: Witold Maszara, Morgan Hill, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 138 days.

(21) Appl. No.: 12/560,938

(22) Filed: Sep. 16, 2009

(65) Prior Publication Data

US 2011/0062443 A1    Mar. 17, 2011

(51) Int. Cl.
*H01L 21/00* (2006.01)
(52) U.S. Cl. ........................................ 438/302; 438/525
(58) Field of Classification Search .......... 438/303–305, 438/525, 592
See application file for complete search history.

(56) References Cited

U.S. PATENT DOCUMENTS

| | | | |
|---|---|---|---|
| 6,787,406 B1* | 9/2004 | Hill et al. | 438/164 |
| 2007/0232003 A1* | 10/2007 | Loo et al. | 438/283 |
| 2009/0057759 A1* | 3/2009 | Obradovic et al. | 257/338 |
| 2009/0146223 A1* | 6/2009 | Jain et al. | 257/408 |

OTHER PUBLICATIONS

A. Kaneko, et al. "High-Performance FinFET with Dopant-Segregated Schotty Source/Drain," IEEE, 2006.

* cited by examiner

*Primary Examiner* — Richard A. Booth
(74) *Attorney, Agent, or Firm* — Ingrassia Fisher & Lorenz, P.C.

(57) ABSTRACT

Embodiments of a method for fabricating a semiconductor device are provided. In one embodiment, the method includes the step of producing a partially-completed semiconductor device including a substrate, source/drain (S/D) regions, a channel region between the S/D regions, a gate stack over the channel region, and sidewall spacers laterally adjacent the gate stack. The method further includes the steps of amorphizing the S/D regions, depositing a silicide-forming material over the amorphized S/D regions, and heating the partially-completed semiconductor device to a predetermined temperature at which the silicide-forming material reacts with the amorphized S/D regions.

13 Claims, 5 Drawing Sheets

THIN BODY SEMICONDUCTOR DEVICES HAVING IMPROVED CONTACT RESISTANCE AND METHODS FOR THE FABRICATION THEREOF

TECHNICAL FIELD

The present invention relates generally to semiconductor device manufacturing processes and, more particularly, to methods for fabricating thin body semiconductor devices, such as fully depleted ultra-thin body transistors, having improved contact resistance.

BACKGROUND

It is becoming increasingly common for metal oxide semiconductor ("MOS") transistors to be produced utilizing semiconductor-on-insulator (SOI) substrates. A conventional SOI substrate includes a thin layer of silicon overlaying an intermediate insulating layer, which is supported by a carrier wafer. The intermediate insulating layer typically comprises silicon oxide and is commonly referred to as a "buried oxide" or "BOX" layer. In certain instances, the silicon layer overlaying the BOX layer may be scaled down in proportion to the dimensions of other device parameters (e.g., gate length). When the overlaying silicon layer has a thickness less than a minimum threshold (e.g., approximately 20 nm), the SOI substrate is commonly referred to as an "ultra thin body" SOI or, more simply, a "UTB" SOI substrate. UTB body thickness is substantially equal to the depletion zone of the transistor and is commonly referred to as a "fully depleted". Relative to partially depleted SOI devices, fully depleted UTB SOI minimizes floating body effects and, thus, permits the switching behavior of the transistor to be substantially unaffected by the transistor's previous state.

Relative to MOS transistors produced on bulk wafers, MOS transistors produced on UTB SOI substrates generally achieve lower junction capacitances and higher operational speeds. However, MOS transistor produced on UTB SOI substrates, tend to exhibit high series resistance. It has recently been proposed that full silicidation of the source/drain ("S/D") regions within a UTB SOI substrate could be performed to form Schottky-like junctions and thereby reduce the series resistance of the transistors ultimately formed on the substrate. However, conventional silicidation processes, including state-of-the-art nickel silicidation processes, have proven less than ideal for this purpose. Due to inherent variations in local silicon film thickness from transistor to transistor, it can be excessively difficult to determine the appropriate volume of silicide-forming material (e.g., nickel) to deposit over a particular transistor formed on a UTB SOI substrate. If too little silicide-forming material is deposited, full silicidation of the S/D regions will not be achieved. Conversely, if too great a volume of silicide-forming material is deposited, the excess silicide-forming material tends to migrate laterally into the channel region and react within the silicon of the channel in a poorly controlled manner. Reaction of the excess silicide-forming material with the silicon of the channel results in the formation of a highly erratic (e.g., jagged) S/D-channel interface. On an individual device level, the formation of a highly erratic S/D-channel interface can cause significant current variations and increased likelihood of channel shorts. On a manufacturing level, the formation of high erratic S/D-channel interfaces reduces device throughput and increases overall cost of production.

Considering the above, it is desirable to provide a method for fabricating a semiconductor device utilizing a thin body substrate, such as a fully depleted ultra-thin body silicon-on-insulator substrate, wherein full silicidation of the S/D regions is achieved in a highly controllable manner to increase product conformity and throughput while reducing the overall cost of manufacture. Preferably, embodiments of such a method would be suitable for use in the production of both planar semiconductor devices and non-planar semiconductor devices, such as FinFETs and trigates. Other desirable features and characteristics of the present invention will become apparent from the subsequent detailed description and the appended claims, taken in conjunction with the accompanying drawings and the foregoing technical field and background.

BRIEF SUMMARY

Embodiments of a method for fabricating a semiconductor device are provided. In one embodiment, the method includes the step of producing a partially-completed semiconductor device including a substrate, source/drain (S/D) regions, a channel region between the S/D regions, a gate stack over the channel region, and sidewall spacers laterally adjacent the gate stack. The method further includes the steps of amorphizing the S/D regions, depositing a silicide-forming material over the amorphized S/D regions, and heating the partially-completed semiconductor device to a predetermined temperature at which the silicide-forming material reacts with the amorphized S/D regions.

Embodiments are also provided of a partially-completed non-planar semiconductor device prior to full silidication. In one embodiment, the partially-completed non-planar semiconductor device includes a fully-depleted ultra-thin body (UTB) SOI substrate, a fin structure formed on the UTB SOI substrate and extending along a first axis, a capping layer overlaying the fin structure, and a gate stack formed over the fin structure and the capping layer. The gate stack extends along a second axis substantially perpendicular to the first axis. The fin structure has a fully amorphized source region, a fully amorphized drain region, and a plurality of channel regions intermediate the fully amorphized source region and the fully amorphized drain region. At least a first ion species is implanted into the fully amorphized source region and into the fully amorphized drain region.

BRIEF DESCRIPTION OF THE DRAWINGS

The present invention will hereinafter be described in conjunction with the following drawing figures, wherein like numerals denote like elements, and wherein.

DETAILED DESCRIPTION

Figure 1:
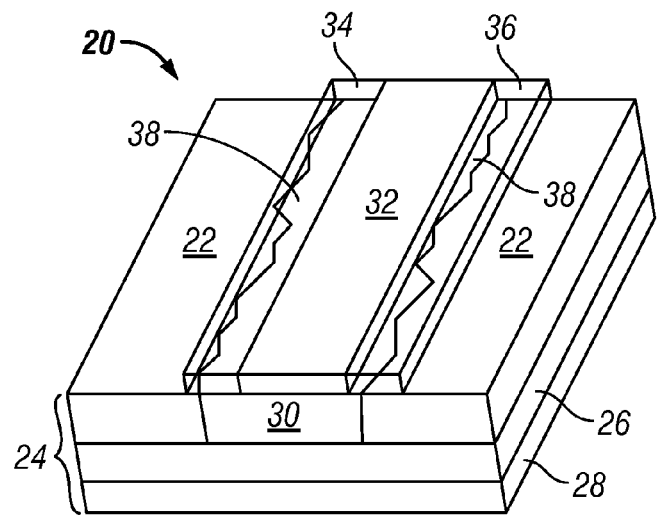
FIG. 1 is a generalized isometric view of a planar semiconductor device having a highly erratic S/D-channel interface formed in accordance with a conventional full silicidation process.

The following Detailed Description is merely exemplary in nature and is not intended to limit the invention or the application and uses of the invention. Furthermore, there is no intention to be bound by any expressed or implied theory presented in the preceding Technical Field, Background, Brief Summary, or the following Detailed Description. Although the term "MOS device" properly refers to a device having a metal gate electrode and an oxide gate insulator, that term will be used throughout to refer to any semiconductor device that includes a conductive gate electrode that is positioned over a gate insulator (whether oxide or other insulator), which is, in turn, disposed over a semiconductor substrate. Furthermore, various steps in the manufacture of MOS transistors are well-known and, in the interests of brevity, will only be mentioned briefly herein or will be omitted entirely without providing the well-known process details As noted in the foregoing section entitled "Background," certain proposed full silicidation processes tend to produce a highly erratic interface between the silicided S/D regions and the channel region of a semiconductor device formed on an ultra-thin body silicon-on-insulator ("UTB SOI") substrate; i.e., a substrate wherein the overlaying silicon layer has a thickness less than approximately 20 nm. Further illustrating this point, FIG. 1 is an isometric view of a generalized MOS device 20 including fully silicided source/drain ("S/D") regions 22 formed utilizing a conventional silicidation process. In this example, MOS device 20 is formed on a fully depleted UTB SOI substrate 24 including an insulating layer 26 (also commonly referred to as a "buried oxide" or "BOX" layer) supported by a silicon carrier wafer 28. A channel region 30 has been created within the upper silicon layer of UTB SOI substrate 24 between S/D regions 22, and a gate stack 32 has been formed over channel region 30. Finally, first and second sidewall spacers 34 and 36 (illustrated in phantom in FIG. 1 to prevent visual obstruction of the S/D-channel interface) have been formed adjacent opposing sidewalls of gate stack 32.

To decrease series resistances, S/D regions 22 of MOS device 20 have been subject to a full silicidation process performed in accordance with the teachings of prior art. During the full silicidation process, a silicide-forming material, such as nickel, is first deposited over MOS device 20 in a volume sufficient to react with substantially all of the silicon within S/D regions 22. MOS device 20 is then subjected to a high temperature annealing process (e.g., involving temperatures exceeding 350 degrees Celsius and commonly approaching 400 degrees Celsius) to initiate reaction of the silicide-forming metal with the silicon of S/D regions 22. During the silicidation process, excess quantities of the silicide-forming material have migrated laterally inward into channel region 30, reacted with the silicon within channel region 30, and produced highly erratic S/D-channel interfaces as indicated in FIG. 1 at 38. As a result of the highly erratic S/D-channel interfaces, the operational characteristics of MOS device 20 may vary significantly from other MOS devices produced utilizing the above-described process. In addition, MOS device 20 may have an increased likelihood of channel shorts and may not meet minimum criteria for commercial viability.

To overcome the above-noted disadvantages associated with full silicidation processes of the type described above, the following describes multiple exemplary embodiments of a method for fabricating a semiconductor device on a thin body substrate wherein a full silicidation process is performed in a controlled manner that produces clearly defined S/D-channel interfaces. A first exemplary embodiment wherein the semiconductor fabrication process is utilized to produce a planar UTB SOI device is described below in conjunction with FIGS. 2-9, and a second exemplary embodiment wherein the semiconductor fabrication process is utilized to produce a non-planar UTB SOI device, in particular a FinFET, is described below in conjunction with FIGS. 10-13. The following examples notwithstanding, embodiments of the semiconductor fabrication method can be utilized to produce various other types of planar and non-planar semiconductor devices (e.g., trigates), whether or not such semiconductor devices are formed utilizing a UTB SOI substrate.

FIGS. 2-9 are simplified cross-sectional views illustrating a series of fabrication steps that can be performed to produce an exemplary MOS device 40 (shown at various stages of completion in FIGS. 2-9) on a thin body substrate wherein the S/D regions undergo full silicidation in a controllable manner. The following is offered by way of example only; it is emphasized that each of the fabrication steps described below may not be performed in all embodiments of the semiconductor fabrication process. Similarly, additional steps may also be performed in embodiments of the semiconductor fabrication process that are conventionally known and thus not described herein in the interest of concision.

Figure 2:
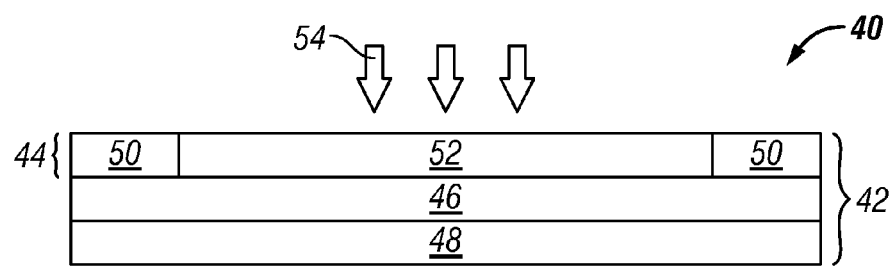
FIGS. 2-8 are generalized cross-sectional views of a planar semiconductor device, at various stages of production, produced in accordance with a first exemplary embodiment of the semiconductor fabrication method.

Referring initially to FIG. 2, an exemplary method for producing a planar MOS device 40 commences with the provision of a silicon substrate 42. As appearing herein, the term "silicon substrate" encompasses the relatively pure silicon materials typically used in the semiconductor industry, as well as silicon admixed with other elements, such as germanium and the like. Silicon substrate 42 can be a bulk silicon wafer. However, as indicated in FIG. 2, silicon substrate 42 preferably assumes the form of an SOI wafer including an upper silicon layer 44 overlaying an intermediate insulating layer 46 (also commonly referred to as a "buried oxide" or "BOX" layer), which is supported by a silicon carrier wafer 48. More preferably, silicon substrate 42 assumes the form of a UTB SOI substrate; i.e., an SOI substrate wherein the thickness of overlaying silicon layer 44 is less than approximately 20 nm.

One or more electrical isolation features are formed within semiconductor substrate 42 utilizing a known electrical isolation technique, such as the localized oxidation of silicon. In the illustrated exemplary embodiment, a shallow trench isolation (STI) formation technique is utilized to form STI features 50 within overlaying silicon layer 44. STI features 50 may be formed, for example, by first etching a shallow trench into overlaying silicon layer 44, growing a thermal oxide liner within the etched trench, and subsequently filling the trench by depositing an oxide into the trench and over the thermal oxide liner. After the formation of STI features 50, a well region 52 is created within overlaying silicon layer 44 and within the boundaries of STI feature 50. If well region 52 is an N-type well region, well region 52 can be formed in overlaying silicon layer 44 via the implantation of arsenic or phosphorus ions (indicated in FIG. 2 by arrows 54). Alternatively, well region 52 can be a P-type well region formed in overlaying silicon layer 44 via the implantation of boron ions.

Figure 3:
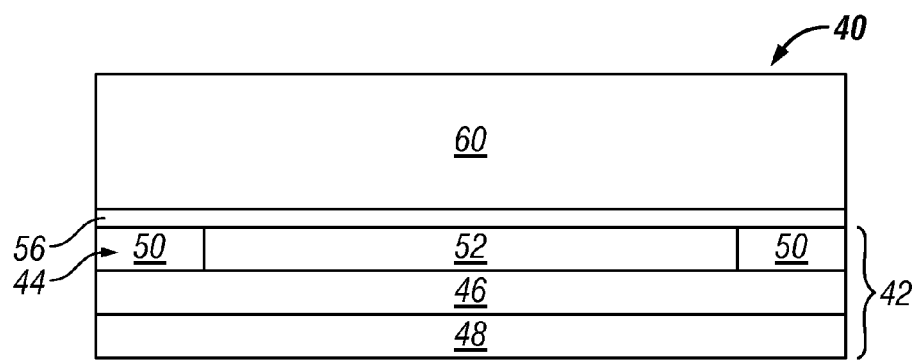

FIG. 3 illustrates partially-completed MOS device 40 after a gate insulator layer 56 and a gate electrode layer 60 have been sequentially formed over upper silicon layer 44 of UTB SOI substrate 42. The sequential formation of gate insulator layer 56 and gate electrode layer 60 are described, in turn, below. Although not shown in FIG. 3 for uniformity, one or more additional layers can also be formed over UTB SOI substrate 42. For example, in certain embodiments, a metal gate layer (e.g., titanium nitride, tantalum nitride, hafnium silicide, tantalum carbide, etc.) may be formed between gate insulator layer 56 and gate electrode layer 60 utilizing, for example, a conventional chemical vapor deposition technique. Additionally or alternatively, various combinations of oxide and nitride capping layers can also be formed over gate electrode layer 60.

Gate insulator layer 56 can comprise any material suitable for insulating gate electrode layer 60 from well region 52. As a first example, gate insulator layer 56 can comprise silicon dioxide thermally grown on the upper surface of silicon layer 44 by heating silicon substrate 42 in an oxidizing ambient. As a second example, gate insulator layer 56 can comprise a high-k dielectric material or other dielectric material deposited over silicon layer 44 utilizing a vapor deposition process, such as chemical vapor deposition (CVD), low pressure chemical vapor deposition (LPCVD), or plasma enhanced chemical vapor deposition (PECVD). A non-exhaustive list of high-k dielectric materials that may be deposited to form gate insulator layer 56 includes hafnium dioxide, hafnium silicon oxide, titanium dioxide, tantalum pentoxide, zirconium dioxide, and various other compounds that have a relatively high dielectric constant as compared to silicon dioxide or silicon oxynitride. The thickness of gate insulator layer 56 will vary depending upon the desired performance characteristics of MOS device 40; however, it is generally preferred that gate insulator layer 56 is deposited to a thickness less than approximately 10 nm.

After the formation of gate insulator layer 56, conductive gate electrode layer 60 is next deposited over gate insulator layer 56 utilizing a conventional deposition technique, such as CVD, LPCVD, or PECVD. Gate electrode layer 60 can be deposited as undoped polycrystalline silicon that is subsequently impurity doped via ion implantation. In one specific implementation, gate electrode layer 60 comprises polycrystalline silicon deposited utilizing LPCVD and a hydrogen-silane reduction. This example notwithstanding, gate electrode layer 60 may comprise various other conductive materials including, but not limited to, titanium nitride, tantalum nitride, hafnium silicide, and tantalum carbide. As a non-limiting example, gate electrode layer 56 can be deposited to a thickness of approximately 1 nm to approximately 100 nm.

Figure 4:
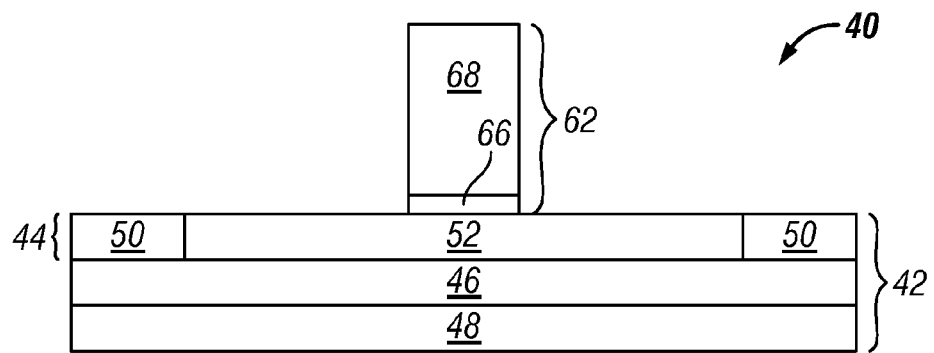

FIG. 4 illustrates partially-completed MOS device 40 after gate insulator layer 56 and gate electrode layer 60 have been patterned and etched to define a gate insulator 66 and a gate electrode 68, respectively. Collectively, gate insulator 66 and gate electrode 68 form a gate stack 62 overlaying channel region 52 formed in upper silicon layer 44 of UTB SOI substrate 42. If desired, a shallow S/D implant may be performed after formation of gate stack 62 to create shallow S/D regions (not shown) within upper silicon layer 44 of UTB SOI substrate 42. Furthermore, in certain embodiments, one or more nitride liner layers and/or one or more oxide liner layers (also not shown) can be sequentially formed overlaying upper silicon layer 44 and gate stack 62 utilizing conventional deposition techniques of type described above.

Figure 5:
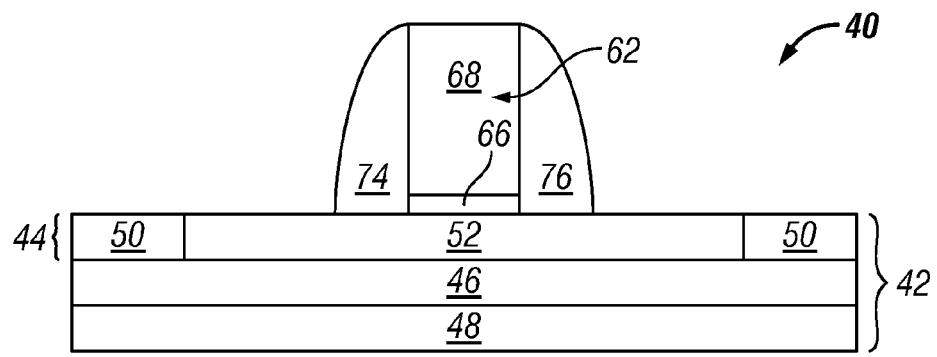

Next, as illustrated in FIG. 5, first and second sidewall spacers 74 and 76 are formed adjacent opposing sidewalls of gate stack 62. In accordance with one exemplary technique, a spacer-forming material (e.g., $SiO_2$, silicon nitride, or an ultra-low k material) is deposited over upper silicon layer 44 and gate stack 62 to form sidewall spacers 74 and 76. In one exemplary case, the spacer-forming material is deposited to a thickness of approximately 15 nm utilizing LPCVD. The spacer-forming material is then anisotropically etched utilizing, for example, a reactive ion etching (RIE) technique employing a carbon hydro-trifluoride ($CHF_3$), tetrafluoromethane ($CF_4$), or sulfur hexafluoride ($SF_6$) chemistry. Although partially-completed MOS device 40 is illustrated in FIG. 5 as including only a single set of sidewall spacers 74 and 76, it will be readily appreciated that multiple sidewall spacers can be utilized in the fabrication of MOS device 40.

Figure 6:
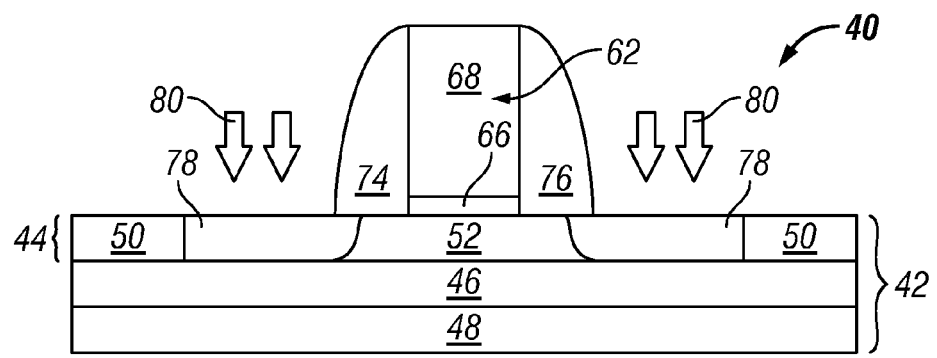

FIG. 6 illustrates partially-completed MOS device 40 during the performance of a deep implantation into upper silicon layer 44 of UTB SOI substrate 42 to form S/D regions 78. During this step, impurity dopant ions are implanted into the surface of semiconductor substrate 42 (indicated in FIG. 6 by arrows 80). If MOS device 40 is an NMOS transistor, phosphorous or arsenic ions can be implanted during deep source/drain implantation. If MOS device 40 is instead a PMOS transistors, boron ions can be implanted. The acceleration voltage and dosage utilized to create S/D regions 78 will inevitably vary depending upon device characteristics (e.g., thickness of upper silicon layer 44 The deep source/drain implants self-align to gate stack 62 and sidewall spacers 74 and 76, which collectively serve as an implant mask.

Although not described in detail herein, raised source/drain regions can be formed over S/D regions 78 utilizing an epitaxial growth process in certain embodiments of the exemplary semiconductor device fabrication process. In such a case, a series of epitaxial pre-cleaning steps may first be performed. A conventional selective epitaxial growth (SEG) process can then be utilized to grow raised source/drain regions on the exposed areas of silicon substrate 42 (over S/D regions 78) and proximate the ends of the channel formed within substrate 42. Furthermore, if MOS device 40 is a PMOS transistor, embedded epitaxial silicon germanium (eSiGe) or like material can be utilized to apply a compressive longitudinal stress to the channel underlying gate stack 62 and thereby increase carrier mobility. If MOS device 40 is a NMOS transistor, silicon carbon (eSiC) or like material can be utilized to apply a tensile longitudinal stress to the channel to increase carrier mobility. If desired, extension source/drain implants and, perhaps, halo implants can also be performed prior to epitaxial growth of the raised source/drain regions.

Figure 7:
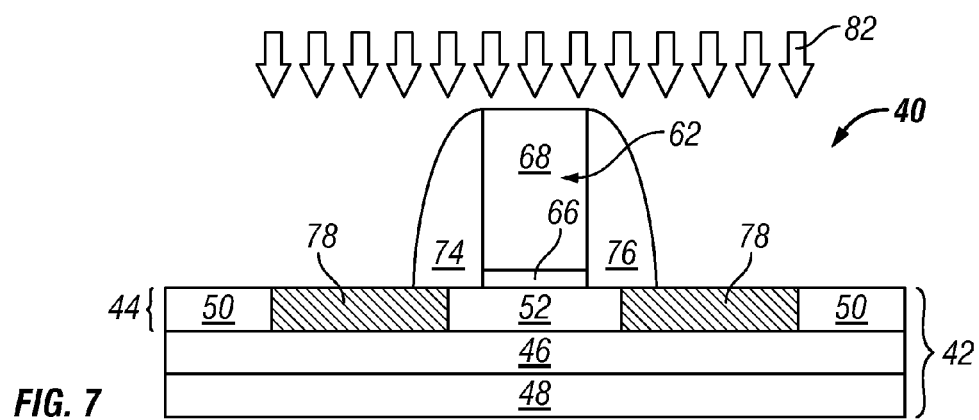

In contrast to conventional semiconductor fabrication processes, and specifically in contrast to conventional full silicidation processes of the type described above, partially-completed MOS device 40 is next subjected to one or more ion implantation steps to fully amorphize S/D regions 78 within upper silicon layer 44. The angle of ion bombardment and number of ion bombardment steps can be varied depending upon the orientation of the S/D regions 78 and whether MOS device 40 is a planar or a non-planar device. In the exemplary embodiment illustrated in FIGS. 2-7, MOS device 40 is a planar device and S/D regions 78 have a horizontal orientation. As indicated in FIG. 7 by arrows 82, a single ion implantation step can thus be performed to amorphize S/D regions 78. In this particular example, MOS device 40 is bombarded with ions at an angle substantially normal to the upper surface of UTB SOI substrate 42 (as represented in FIG. 7 by arrows 82). The energy and dosage is preferably selected such that the ions do not penetrate through gate stack 62 and sidewall spacers 74 and 76 or, stated differently, such that gate stack 62 and sidewall spacers 74 and 76 serve as an ion implantation mask. Consequently, the silicon within S/D regions 78 is fully amorphized during ion implantation, while the silicon within channel region 52 remains in its crystalline state. Notably, the uniformity of the boundary between the amorphized and non-amorphized (crystalline) silicon is generally determined by the straightness of the outer edges of sidewall spacers 74 and 76. Conventional spacer-forming techniques, such as the above-described spacer-forming technique, create sidewall spacers with acceptably straight outer edges. Thus, by using the outer edges of sidewall spacers 74 and 76 in this manner, clearly defined boundaries are formed between the amorphized silicon of S/D regions 78 and the un-amorphized silicon within channel region 52.

In the exemplary embodiment illustrated in FIG. 7, ion bombardment is performed at an angle substantially normal to UTB SOI substrate 42. Consequently, the junctures between the amorphized silicon of S/D regions 78 and the un-amorphized silicon within channel 72 are formed directly beneath or near the outer lateral edges of sidewall spacers 74 and 76; it will be noted that the junctures between the amorphized silicon and un-amorphized (crystalline) silicon may be located directly beneath the outer edges of spacers 74 and 76 due to lateral straggle. However, in alternative embodiments, ion bombardment can be performed at an angle to adjust the lateral position of the amorphized/un-amorphized silicon juncture as desired. Any species of ion suitable for fully amphorizing the silicon of S/D regions 78 can be implanted during ion implantation including, but not limited to, silicon, germanium, xenon, and certain noble gases (e.g., argon, neon, etc.). However, it is generally preferred that relatively heavy ion species is implanted into UTB SOI substrate 42 to maximize efficacy, reduce the required dosage, and minimize the duration of the amorphization process. Thus, in a preferred embodiment, silicon, germanium, and/or xenon ions are implanted into S/D regions 78 during ion bombardment; and, in a more preferred embodiment, germanium or xenon ions are implanted into S/D regions 78 during ion bombardment.

Figure 8:
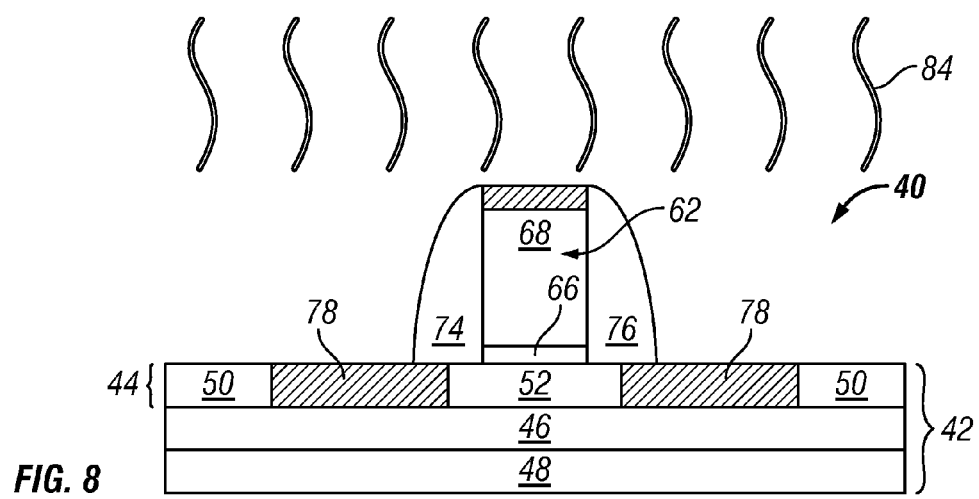

Next, as illustrated in FIG. 8, MOS device 40 is subjected to a full silidication process. During silicidation, a silicide-forming material is deposited over the upper surface of UTB SOI substrate 42, sidewall spacers 74 and 76, and gate stack 62. For example, in one embodiment, nickel can be deposited over UTB SOI substrate 42, sidewall spacers 74 and 76, and gate stack 62 utilizing a sputtering process. The silicide-forming material is preferably deposited in volume sufficient to react with substantially all of the silicon within amorphized S/D regions 78. As indicated in FIG. 8 by heat lines 84, MOS device 40 is heated to a predetermined temperature during silicidation. As a point of emphasis, the present inventor has observed that amorphous silicon will react with a silicide-forming material, such as nickel, at a significantly lower temperature than will non-amorphous, monocrystalline silicon. Accordingly, the predetermined temperature to which MOS device 40 is heated during silicidation is preferably selected to be a temperature at which the silicide-forming material reacts readily with the amorphous silicon within S/D regions 78, but generally does not react with the non-amorphous (crystalline) silicon within channel region 50. The predetermined temperature to which MOS device 40 is heated during silicidation will inevitably vary amongst different embodiments of the semiconductor fabrication process depending upon, for example, the type of silicide-forming material deposited over UTB SOI substrate 42. However, as one non-limiting example, MOS device 40 may be heated to a maximum predetermined temperature less than approximately 340 degrees Celsius during the silicidation process. It will be noted that, even if heated to the maximum exemplary temperature of approximately 340 degrees Celsius, the silidication process described herein is still performed at temperatures that are approximately 10 degrees or more below the minimum temperatures to which semiconductor devices are typically heated during conventional full silicidation processes of the type described above in conjunction with FIG. 1.

When silicidation is performed over the reduced temperature range described above, the silicide-forming material reacts with all of the amorphized silicon of S/D regions 78. If exposed to the silicide-forming material, an upper portion of gate electrode 68 may also undergo silidication as indicated in FIG. 8 at 86. Conversely, little to no silicide-forming material reacts with the crystalline silicon within channel region 52. Advantageously, the exceptional uniformity of the boundary between the amorphized silicon and the crystalline silicon is imparted to the interface between the silicided S/D regions 78 and the channel region 52. As may be appreciated by referring to FIG. 9, which is an isometric view of MOS device 40 after full silicidation, a clearly defined S/D-channel interface is created between S/D regions 78 and channel region 52. The likelihood of current shorts within MOS device 40 is consequently reduced, and device conformity is improved (e.g., device-to-device current variations are minimized).

Figure 9:
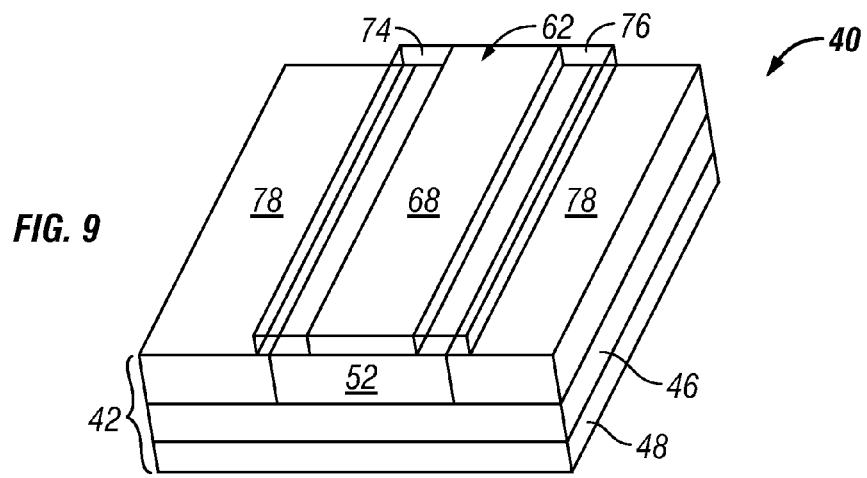
FIG. 9 is a generalized isometric view of the planar semiconductor device illustrated in FIG. 8 illustrating the well defined S/D-channel interface formed in accordance with the first exemplary embodiment of the semiconductor fabrication method illustrated in FIGS. 2-8.

A indicated in FIGS. 8 and 9, after full silicidation of S/D regions 78, any silicide-forming material that is not in contact with exposed silicon (e.g., the silicide-forming material that is deposited onto sidewall spacers 74 and 76) does not react during silicidation to form a silicide and can subsequently be removed via wet etching in a $H_2O_2/H_2SO_4$ or $HNO_3/HCl$ solution. Additional steps are then performed to complete processing of MOS device 40 (e.g., the deposition of an interlayer dielectric, further etching steps to provide vias to the source and drain regions, deposition of metal plugs, etc); such steps are well-known in the industry and are thus not described herein.

Figure 10:
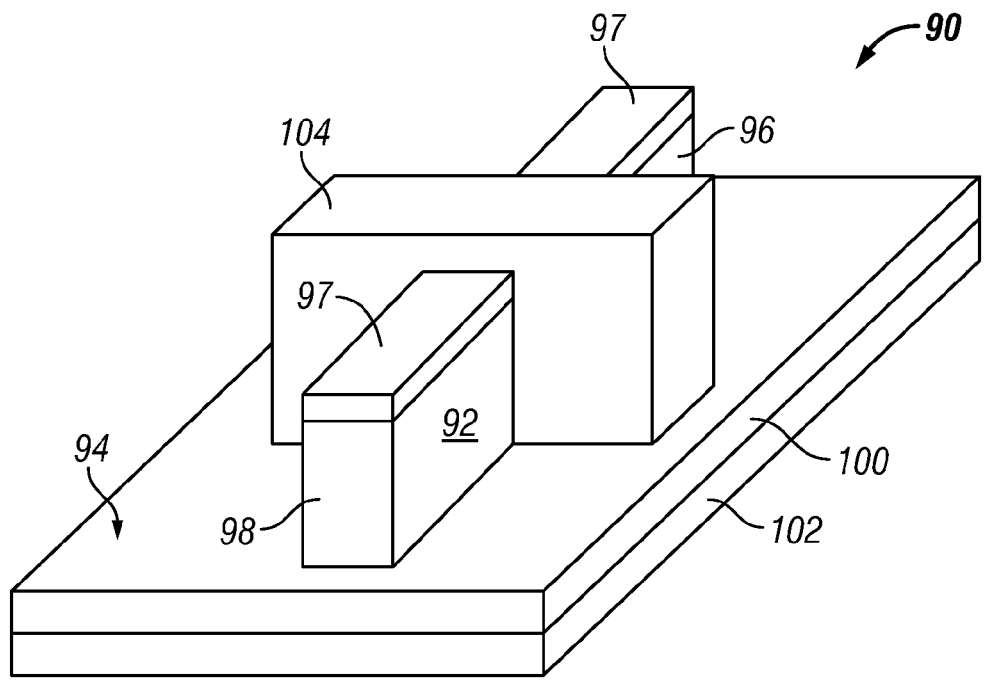
FIGS. 10-13 are views of a non-planar semiconductor device, at various stages of production, produced in accordance with a second exemplary embodiment of the semiconductor fabrication method.

There has thus been provided a first exemplary embodiment of a method for fabricating a UTB SOI semiconductor device wherein the S/D regions undergo full silicidation in a highly controllable manner so as to increase product conformity and throughput while reducing the overall cost of manufacture. While the foregoing described an exemplary embodiment utilized to produce a generalized semiconductor planar device, embodiments of the semiconductor fabrication method can also be utilized to produce non-planar semiconductor devices, such as FinFETs and trigates. Further emphasizing this points, FIGS. 10-13 illustrate a non-planar semiconductor device, namely, a FinFET 90, at various stages of production and produced in accordance with a second exemplary embodiment of the semiconductor fabrication method. Referring initially to FIG. 10, the illustrated portion of FinFET 90 includes a single fin structure 92 formed on a substrate 94. As was the case previously, substrate 94 assumes the form of a silicon-on-insulator (SOI) substrate including an insulating layer 100 supported by a carrier wafer 102. In a preferred embodiment, substrate 94 assumes the form of an ultra-thin body SOI substrate of the type described above. As will be readily appreciated, the upper silicon layer of SOI substrate 94 has been etched to define fin structure 92; e.g., in one well-known technique, sacrificial mandrels are formed above the upper silicon layer of the SOI substrate, sidewall spacers are formed adjacent the sacrificial mandrels, the sacrificial mandrels are removed utilizing an etching process, and the upper silicon layer is etched using the sidewall spacers as an etch mask to yield separate fin structures beneath each sidewall spacer. Furthermore, in accordance with an embodiment of the invention, a capping layer 97 has been formed overlaying fin structure 92. Capping layer 97 can be formed by, for example, deposition of an insulating material, such as a nitride or oxide, over the upper surface of fin structure 92. The foregoing notwithstanding, FinFET 90 may not include a capping layer in alternative embodiments.

With continued reference to FIG. 10, after the formation of fin structure 92 and capping layer 97, a gate stack 104 is formed over the upper surface of SOI substrate 94 and extends along an axis substantially perpendicular to the axis along which fin structure 92 extends. Gate stack 104 extends across and over fin structure 92 such that an intermediate portion of gate stack 104 conformally overlays three surfaces of fin structure 92 (i.e., an upper surface, a first sidewall surface, and a second opposing sidewall surface of fin structure 92).

As is conventionally known, a source 96 and a drain 98 are formed within opposing end portions of fin 92. Collectively, source 96 and drain 98 form source/drain (S/D) regions 96, 98. Although not shown in FIG. 10 for clarity, sidewall spacers are selectively formed adjacent opposing sidewalls of gate stack 104. In one embodiment, the sidewall spacers are formed adjacent gate stack 104 via blanket deposition of a spacer material (e.g., silicon nitride or silicon oxide) over SOI substrate 94, fin structure 92, and gate stack 104. One or more etching steps are then performed to remove the spacer material adjacent fin structure 92 while leaving intact portions of the spacer material adjacent opposing sidewalls of gate stack 104 that ultimately serve as the sidewall spacers.

Figure 11:
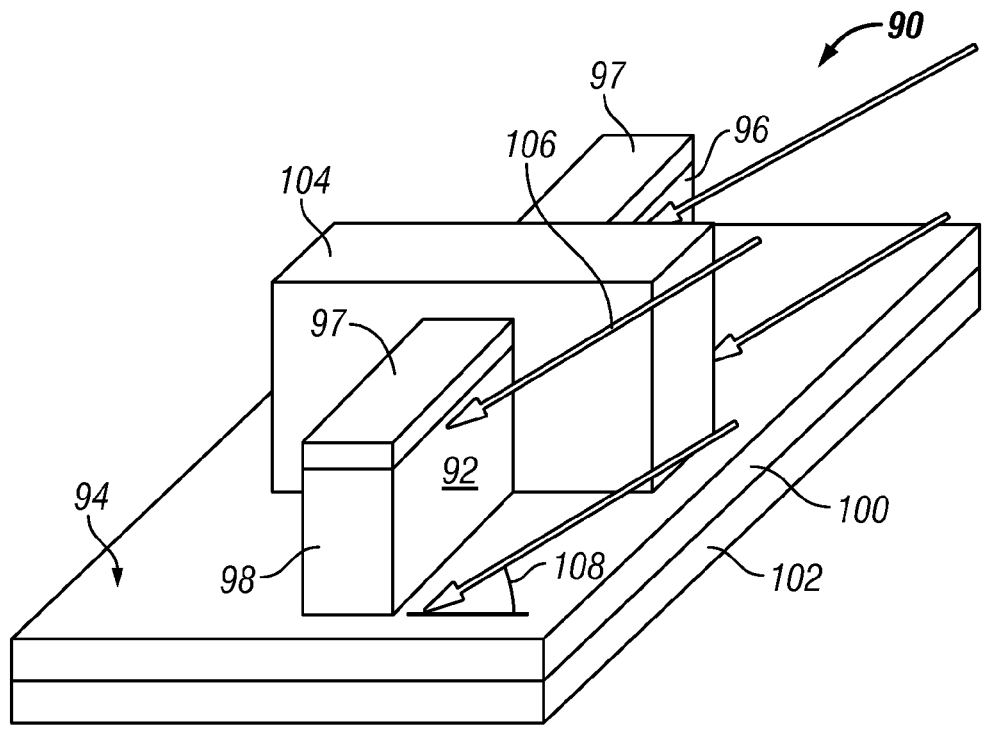

As was MOS device 40 described above in conjunction with FIGS. 2-9, FinFET 90 is next bombarded with a selected ion species to amorphize the silicon of S/D regions 96, 98. As noted above, the selected ion species is preferably silicon, germanium, or xenon. However, in contrast to the above-described fabrication method, FinFET 90 is subjected to at least two angled ion bombardments, which are performed from opposing directions. For example, as represented in FIG. 11 by arrows 106, FinFET 90 may first be bombarded with ions from a first direction to amorphize a first portion (e.g., a first half) of S/D regions 96, 98. The first ion bombardment is preferably performed from a first direction that forms an acute grazing with the upper surface of SOI substrate 94 (indicated in FIG. 11 at 108). As a non-limiting example, the acute grazing angle may be approximately 20 degrees. The desired grazing angle may be achieved by tilting the wafer with respect to the ion bombardment apparatus.

Figure 12:
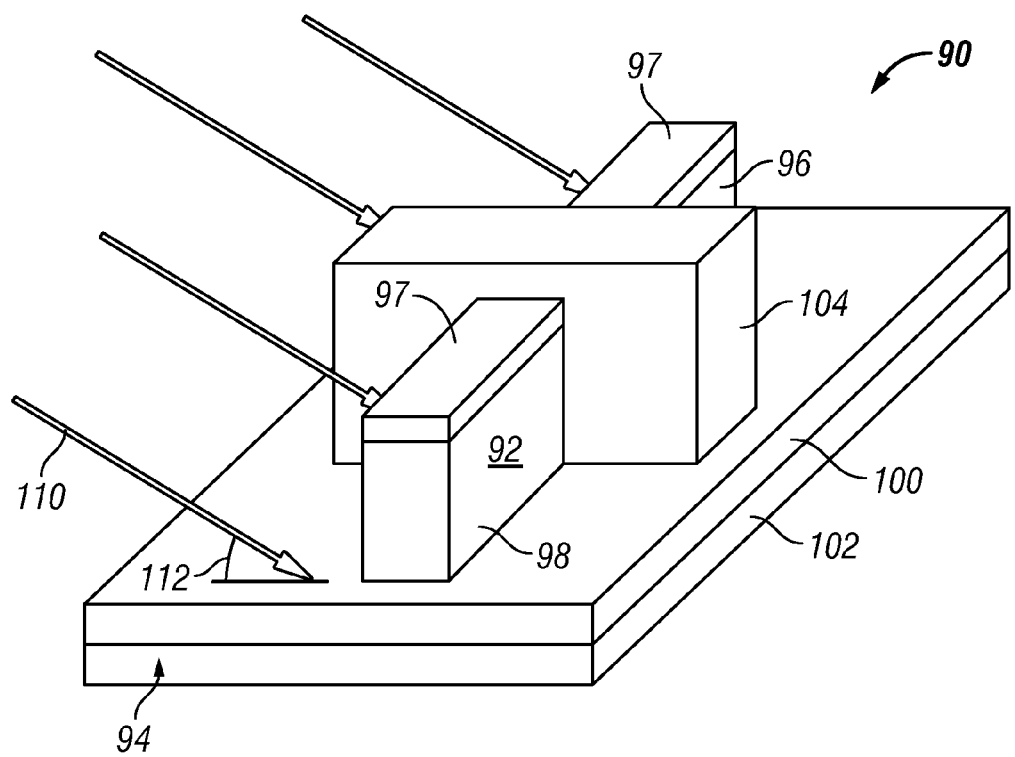

After the first ion bombardment (FIG. 11), FinFET 90 is subjected to a second ion bombardment. As indicated in FIG. 12 at 110, the second ion bombardment is performed from a second direction, which is substantially the mirror opposite the first direction. In one embodiment, the wafer is rotated 180 degrees after the first ion bombardment. As was the case previously, ion bombardment is preferably performed from a second direction that forms an acute grazing (e.g., 20 degrees) with the upper surface of SOI substrate 94 (indicated in FIG. 11 at 112). By subjecting FinFET 90 to two opposing angled ion bombardments in this manner, vertically-orientated S/D regions 96, 98 of fin structure 92 are fully amorphized.

Figure 13:
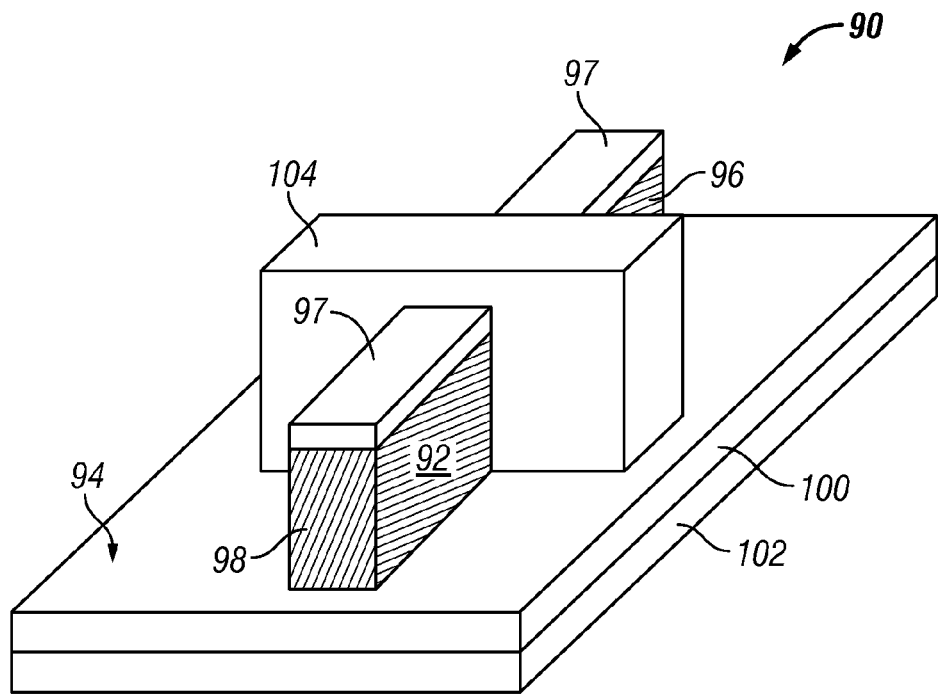

Finally, referring to FIG. 13, FinFET 90 undergoes a silicidation process to fully silicide S/D regions 96, 98 of fin structure 92 (indicated in FIG. 13 by cross-hatching). During silicidation, a silicide-forming material, such as nickel, is deposited (e.g., via sputtering) over the upper surface of SOI substrate 94, gate stack 104, and fin structure 92. As previously indicated, the silicide-forming material is preferably deposited in volume sufficient to react with substantially all of the silicon within amorphized S/D regions 96, 98. FinFET 90 is then heated to a predetermined temperature at which the silicide-forming material readily reacts with the amorphized silicon within S/D regions 96, 98, but generally does not react with the un-amorphized (crystalline) silicon within the FinFET channels. The unreacted silicide-forming material is then removed utilizing, for example, a wet etch. As noted above, the predetermined temperature to which FinFET 90 is heated is less than the temperatures typically associated with conventional silicidation processes, which commonly exceed 350 degrees Celsius and approach 400 degrees Celsius. In one embodiment, FinFET 90 is heated to a predetermined temperature less than approximately 340 degrees Celsius. As a result of this modified silicidation process (wherein S/D regions 96, 98 are amorphized and silicidation is carried out at a lower temperature), substantially all of the silicon within S/D regions 96, 98 forms a silicide, while little to no silicon within the FinFET channels forms a silicide. A S/D-channel interface having exceptional uniformity is consequently produced, which reduces the likelihood of channel shorts and improves device conformity. It will be noted that capping layer 97, when provided, generally prevents the silicide-forming material from reacting directly with the upper surface of FinFET 90, which enables the silicidation process, as well as the gate and spacer etches, to be better controlled. After the above-described silicidation process, additional conventionally-known steps are performed as needed to complete fabrication of FinFET 90.

There has thus been provided multiple exemplary embodiments of a method for fabricating a semiconductor device, whether planar or non-planar, wherein full silicidation of the S/D regions is achieved in a highly controllable manner to increase product conformity and throughput while reducing the overall cost of manufacture. Although by no means limited to such a use, the above-described exemplary embodiments of the semiconductor fabrication method are especially useful for fabricating a semiconductor device utilizing a thin body substrate and, in particular, utilizing a fully depleted ultra-thin body silicon-on-insulator substrate. This notwithstanding, it is emphasized that embodiments of the semiconductor fabrication method described herein are equally applicable to semiconductor devices (e.g., FinFETs) produced utilizing other types of substrates, including bulk silicon wafers.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing the exemplary embodiment or exemplary embodiments. It should be understood that various changes can be made in the function and arrangement of elements without departing from the scope of the invention as set forth in the appended Claims and the legal equivalents thereof.

What is claimed is:

1. A method for fabricating a semiconductor device, comprising the steps of:
    producing a partially-completed semiconductor device including a substrate, source/drain (S/D) regions, a channel region between the S/D regions, a gate stack over the channel region, and sidewall spacers laterally adjacent the gate stack;
    amorphizing the S/D regions;
    depositing a silicide-forming material over the amorphized S/D regions; and
    heating the partially-completed semiconductor device to a maximum predetermined temperature less than 340 degrees Celsius to initiate reaction of the silicide-forming material with the amorphized S/D regions, while generally preventing the reaction of the silicide-forming material with the un-amorphized silicon of the channel region.

2. A method according to claim 1 wherein the step of amphorizing comprises bombarding the semiconductor device with a first ion species from a predetermined direction.

3. A method according to claim 2 wherein the first ion species is selected from the group consisting of germanium and xenon.

4. A method according to claim 1 wherein the step of amorphizing comprises bombarding the partially-completed semiconductor device with ions at an angle substantially normal to the upper surface of the substrate.

5. A method according to claim 1 wherein the step of amorphizing comprises:
performing a first ion bombardment from a first direction forming an acute grazing angle with the upper surface of the substrate; and
performing a second ion bombardment from a second direction forming an acute grazing angle with the upper surface of the substrate.

6. A method according to claim 5 wherein the first direction is substantially the mirror opposite of the second direction.

7. A method according to claim 5 wherein step of producing comprises producing a non-planar semiconductor device including a fin structure, wherein the step of performing a first ion bombardment comprises implanting ions into a first portion of the fin structure, and wherein the step of performing a second ion bombardment comprises implanting ions into a second portion of the fin structure substantially opposite the first portion of the fin structure.

8. A method according to claim 7 further comprising the step of forming a capping layer overlaying the fin structure.

9. A method according to claim 1 wherein the step of producing comprises producing the partially-completed semiconductor device on a silicon-on-insulator (SOI) substrate.

10. A method according to claim 9 wherein the step of producing comprises producing the partially-completed semiconductor device on an ultra-thin body (UTB) SOI substrate including an upper silicon layer having a thickness less than approximately 20 nm.

11. A method according to claim 1 wherein the step of depositing comprises depositing a silicide-forming material over the amorphized S/D regions in a volume sufficient to react with substantially all of the silicon within the amorphized S/D regions.

12. A method for fabricating a non-planar semiconductor device, comprising the steps of:
providing a silicon-on-insulator (SOI) substrate;
producing a partially-completed non-planar semiconductor device on the SOI substrate, the partially-completed including source/drain (S/D) regions, a channel region between the S/D regions, and a gate stack over the channel region;
forming sidewall spacers laterally adjacent the gate stack;
performing a first ion bombardment from a first direction forming an acute grazing angle with the upper silicon layer of the SOI substrate to amorphize a first portion of the S/D regions;
performing a second ion bombardment from a second direction forming an acute grazing angle with the upper silicon layer of the SOI substrate to amorphize a second portion of the S/D regions substantially opposite the first portion, the second direction being the substantial mirror opposite of the first direction;
depositing a silicide-forming material over the amorphized S/D regions; and
heating the non-planar partially-completed semiconductor device to a maximum predetermined temperature less than 340 degrees Celsius to initiate reaction of the silicide-forming material with the amorphized S/D regions, while generally preventing reaction of the silicide-forming material with crystalline silicon within the channel region.

13. A method according to claim 12 wherein the step of providing comprises providing a fully-depleted ultra-thin body (UTB) SOI substrate including an upper silicon layer having a thickness less than approximately 20 nm.

* * * * *